United States Patent
Matsuoka

(10) Patent No.: US 7,072,236 B2
(45) Date of Patent: Jul. 4, 2006

(54) SEMICONDUCTOR MEMORY DEVICE WITH PRE-SENSE CIRCUITS AND A DIFFERENTIAL SENSE AMPLIFIER

(75) Inventor: Nobuaki Matsuoka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 77 days.

(21) Appl. No.: 10/901,642

(22) Filed: Jul. 28, 2004

(65) Prior Publication Data

US 2005/0024967 A1  Feb. 3, 2005

(30) Foreign Application Priority Data

Jul. 28, 2003 (JP) ............................. 2003-280556

(51) Int. Cl.
*G11C 7/02* (2006.01)
(52) U.S. Cl. ........................ 365/207; 365/205; 365/210
(58) Field of Classification Search .................... None
See application file for complete search history.

(56) References Cited

U.S. PATENT DOCUMENTS 6,324,112 B1 * 11/2001 Fournel ...................... 365/207

FOREIGN PATENT DOCUMENTS

JP  62-008398  1/1987
JP  2-285593  11/1990

* cited by examiner

*Primary Examiner*—David Lam
(74) *Attorney, Agent, or Firm*—Morrison & Foerster LLP

(57) ABSTRACT

A reading circuit of a memory cell includes multiple reference cells each having at least one of multiple possible states of the memory cell, a first pre-sense circuit for supplying current to the memory cell and outputting a first output voltage according to a storage state of the memory cell, a plurality of second pre-sense circuits for supplying currents to the multiple reference cells and outputting second output voltages according to storage states of the reference cells, and a sense amplifier. The sense amplifier is constructed so that one of differential input stages of a differential amplifier is divided in parallel into the same number of pieces as that of the reference cells, the second output voltages of the plurality of second pre-sense circuits are supplied to the divided inputs, and the first output voltage of the first pre-sense circuit is supplied to the other differential input stage.

12 Claims, 6 Drawing Sheets

SEMICONDUCTOR MEMORY DEVICE WITH PRE-SENSE CIRCUITS AND A DIFFERENTIAL SENSE AMPLIFIER

BACKGROUND OF THE INVENTION

1. Field of the Invention

The present invention relates to a semiconductor integrated circuit device and, particularly, to a semiconductor memory device. More particularly, the invention relates to a reading circuit of a semiconductor memory device, for detecting current flowing in a memory cell to determine a storage state of the memory cell.

2. Description of the Related Art

In a semiconductor memory device, various methods are used to read a storage state of a memory cell. A flash memory as one of nonvolatile semiconductor memory devices will be described as an example. Each memory cell in the flash memory has a memory transistor of a floating gate structure, and the flash memory stores information in accordance with an accumulation amount of charges (electrons) injected into a floating gate of each memory cell. More specifically, in a state where a large amount of electrons are injected into the floating gate, an inversion layer is not easily formed in a channel region, so that a threshold voltage of the memory cell becomes high (defined as a program state). On the other hand, in a state where electrons are discharged from the floating gate, an inversion layer is easily formed in the channel region, so that the threshold voltage of the memory cell becomes low (defined as an erase state). In order to determine whether the state of a selected memory cell is the program state or the erase state at high speed, a reference cell having a threshold voltage which is intermediate between the program state and the erase state is prepared and the threshold voltage is input to a differential input-type sense amplifier.

FIG. 2 shows a basic circuit configuration of such a determination circuit, that is, a reading circuit of a memory cell. The reading circuit shown in FIG. 2 includes a reference cell 204, a selected memory cell 205 which is selected to be read among a plurality of memory cells, a first pre-sense circuit for supplying current from a load circuit 206 to the selected memory cell 205 and outputting a first output voltage according to a storage state of the selected memory cell 205 to a node slsel, a second pre-sense circuit for supplying current from a load circuit 201 to the reference cell 204 and outputting a second output voltage according to a storage state of the reference cell 204 from a node slref, and a sense amplifier 200 for comparing the first output voltage and the second output voltage with each other and determining whether the state of the selected memory cell is a program state or an erase state. The source of the reference cell 204 is grounded, and the drain is connected to the source of an N-type MOSFET 202 as a selection transistor. The drain of the N-type MOSFET 202 is connected to the load circuit 201 and one of inputs of the sense amplifier 200 by the node slref. Similarly, the source of the selected memory cell 205 is grounded and the drain is connected to the source of an N-type MOSFET 203 as a selection transistor. The drain of the N-type MOSFET 203 is connected to the load circuit 206 and the other input of the sense amplifier 200 by the node slsel.

The sense amplifier 200 is constructed by using a known circuit. For example, a current mirror-type sense amplification circuit as shown in FIG. 3 is known. A current mirror is constructed by connecting the gates of P-type MOSFETs P1 and P2 and the drain of P1, the drains of N-type MOSFETs N1 and N2 and the drains of the P-type MOSFETs P1 and P2 are connected to each other, and the sources of the N-type MOSFETs N1 and N2 are connected to the drain of an N-type MOSFET N3. The source of the N-type MOSFET N3 is grounded, and a bias voltage is applied to the gate. By using the current mirror-type sense amplifier having such a configuration, a reading operation is performed by comparing a bit line voltage (second output voltage) of the node slref of a reference cell and a bit line voltage (first output voltage) of the node slsel of a selected cell with each other. It is assumed herein that the threshold voltage of the reference cell 204 is 3 V. In the case where the selected memory cell 205 has a threshold voltage higher than 3 V, the amount of current flowing in the selected memory cell 205 is smaller than the amount of current flowing in the reference cell 204. Consequently, if the resistance characteristic of the load circuit 201 and that of the load circuit 206 are equivalent to each other, the first output voltage is higher than the second output voltage. The voltage difference is amplified by the differential input-type sense amplifier 200, and an L-level (low voltage level) output sdout of the sense amplifier 200 is obtained. On the other hand, in the case where the selected memory cell has the threshold voltage lower than 3 V, the amount of current flowing in the selected memory cell 205 is larger than that of the current flowing in the reference cell 204. Consequently, if the resistance characteristic of the load circuit 201 and that of the load circuit 206 are equivalent to each other, the first output voltage is lower than the second output voltage. The voltage difference is amplified by the differential input-type sense amplifier 200, and the H-level (high voltage level) output sdout of the sense amplifier 200 is obtained. From the viewpoints of uses and chip areas, a number of other circuit configurations of the sense amplifier 200 exist. Although the P-channel current mirror-type sense amplification circuit is shown in FIG. 3, for example, an N-channel current mirror-type sense amplification circuit as disclosed in JP-A 62-008398 (1987) may be used. In this case, it is sufficient to construct a current mirror circuit by N-type MOSFETs and to input a signal to the gate of a P-type MOSFET.

As the capacity of a memory increases, the number of memory cells connected to each bit line increases and, in addition, the bit line length also increases. Consequently, wiring delay caused by increase in an RC constant of parasitic resistance on a bit line and capacitance also increases. In order to solve the problem, a method of minimizing the influence of the parasitic resistance of a bit line and capacitance by introducing a feedback-type bias circuit is employed. The method is disclosed in, for example, JP-A2-285593 (1990) and the like.

FIG. 4 shows an example of the reading circuit using the feedback-type bias circuit. The source of a reference cell 411 is grounded, the drain is connected to the source of an N-type MOSFET 400 and a charging circuit 403 via a selection transistor 404. The source of the N-type MOSFET 400 is connected to an input of an inverter 401, and an output of the inverter 401 is connected to the gate of the N-type MOSFET 400, thereby constructing a feedback type bias circuit 410. Further, the drain of the N-type MOSFET 400 is connected to the sense amplifier 200 and a load circuit 402 by the node slref. The source of a selection memory cell 412 is grounded and the drain is connected to the source of an N-type MOSFET 405 and a charging circuit 408 via a selection transistor 409. The source of the N-type MOSFET 405 is connected to an input of an inverter 406, and an output of the inverter 406 is connected to the gate of the N-type MOSFET 405, thereby constructing a feedback type bias circuit. Further, the drain of the N-type MOSFET 405 is connected to the sense amplifier 200 and a load circuit 407 by the node slsel.

The operation of the reading circuit shown in FIG. 4 will now be described. First, nodes n1 to n4 are charged by the charging circuits 403 and 408. It is desirable to adjust the inversion level of the inverters 401 and 406 so as to cut off the N-type MOSFETs 400 and 405 when Vgs (gate-source voltage) of the N-type MOSFETs 400 and 405 is around a threshold voltage. It is also desirable to set the charging level around the inversion level. As a result, the nodes slsel and slref are separated from the nodes n1 and n3 by the N-type MOSFETs 400 and 405 and are charged to predetermined high voltage levels by the load circuits 407 and 402, respectively. The period of charging by the charging circuits 403 and 408 starts before a word line WL for activating the reference cell 411 and the selection memory cell 412 rises. When the word line WL rises and, after lapse of predetermined time, the charging circuits 403 and 408 are stopped, in the case where the selection memory cell 412 is in an erase state, the voltage of the node n3 drops, and the input level of the inverter 406 becomes the inversion level or less. Therefore, Vgs (gate-source voltage) of the N-type MOSFET 405 becomes the threshold voltage or higher, and an ON state is abruptly obtained. Consequently, the first output voltage of the node slsel drops so as to follow the node n3. On the other hand, when the selected memory cell is in the program state, no current flows from the selected memory cell, so that the voltage of the node n3 does not drop. Therefore, the N-type MOSFET 405 is turned off, so that the node slsel maintains a charging level by the load circuit 407.

However, since the reference cell 411 has the intermediate threshold voltage between the program state and the erase state as described above, the voltage of the node n1 drops though more gently than that of the node n3, and the input level of the inverter 401 becomes the inversion level or less. Consequently, Vgs (gate-source voltage) of the N-type MOSFET 400 becomes the threshold voltage or higher and, though more gently than that of the N-type MOSFET 405, the N-type MOSFET 400 is turned on abruptly. Therefore, the second output voltage of the node slref also once drops so as to follow the node n1.

Therefore, in the case where the selected memory cell 412 is in the erase state, both of the first output voltage at the node slsel and the second output voltage at the node slref drop simultaneously. Finally, the first output voltage drops to a voltage value at which load current of the load circuit 407 and cell current of the selected memory cell 412 in the erase state are equal to each other, the second output voltage drops to a voltage value at which load current of the load circuit 402 and cell current of the reference cell 411 are equal to each other, and a voltage difference occurs between the first and second output voltages. Since drop speeds of the first and second output voltages depend on the load (parasitic resistance and capacitance) of a bit line, reading speed decreases. The effect exhibited by introducing the feedback-type bias circuit is not displayed at all and, instead, an adverse influence is exerted.

It is assumed in the above description that direct-current load circuits are used as the load circuits 402 and 407. Also on assumption that dynamic-type load cells start charging the nodes slsel and slref and also stop the charging circuits 403 and 408, similarly, the charging speeds of the first and second output voltages depend on the load (parasitic resistance and capacitance) of a bit line.

Since a flash memory is a memory in which the threshold voltage of a memory cell can be controlled, a reference voltage (second output voltage) used at the time of reading can be easily generated by freely setting the threshold voltage of a reference cell which is the same memory cell. On the other hand, nonvolatile memories are realized by storing information by changing electric resistance and reading information associated with the changed resistance value, such as MRAM (Magnetic Random Access Memory), OUM (Ovonic Unified Memory) and RRAM (Resistance control nonvolatile Random Access Memory). In such a memory of a variable resistive element-type, it is difficult to generate an intermediate resistance value by one cell, so that a reference cell indicative of an intermediate resistance value is obtained by combined resistance by using four variable resistive elements of bipolar ends. FIG. 5 shows the reference cell. Two sets of resistors, in each of which Rma (program state) of a high electric resistance value and Rmi (erase state) of a low electric resistance value are connected in series, are connected in parallel, thereby generating a reference resistance value of 1 (Rma+Rmi)/2. In this case, however, the reference cell is constructed by including four variable resistive elements and, in contrast, the selected memory cell is constructed by including one variable resistive element. Consequently, a problem occurs such that it is difficult to make the volume loads of the reference cell and the selected memory cell equal to each other. Due to this, wait time occurs until the reference voltage is stabilized. There is consequently the possibility such that reading speed is influenced and, in some cases, a read error is induced.

As described above, when the reference cell having a threshold voltage and a resistance value each of which is intermediate between the program state and the erase state is used, problems occur such that the high-speed reading technique adapted to larger capacity cannot be sufficiently utilized, and it is difficult to make the volume load of the reference cell and that of the selected memory cell equal to each other.

SUMMARY OF THE INVENTION

The present invention has been achieved in consideration of the problems and its object is to provide a semiconductor memory device capable of performing high-speed and stable reading operation without using an intermediate threshold voltage or resistance value between a program state and an erase state.

In order to achieve the above object, a semiconductor memory device according to the invention comprises: a memory cell for storing information in accordance with a change in a state; a plurality of reference cells each having at least one of a plurality of possible states of the memory cell; a first pre-sense circuit for supplying current to the memory cell and outputting a first output voltage according to a storage state of the memory cell; a plurality of second pre-sense circuits for supplying currents to the plurality of reference cells and outputting second output voltages according to storage states of the plurality of reference cells; and a sense amplifier taking the form of a differential amplification circuit constructed so that one of inputs of the differential amplification circuit is divided in parallel into the same number of pieces as the number of the reference cells, the second output voltages of the plurality of second pre-sense circuits are supplied to the divided pieces, and the first output voltage of the first pre-sense circuit is supplied to the other input of the differential amplification circuit.

In the semiconductor memory device according to the invention, both of the inputs of the differential amplification circuit are constructed by MOS transistors of the same number as that of the reference cells, the second output voltages of the plurality of second pre-sense circuits are supplied to the gates of the MOS transistors constructing the one of the inputs, and the first output voltage of the first pre-sense circuit is supplied to all of gates of the MOS transistors constructing the other input.

In the semiconductor memory device according to the invention, without preparing reference cells having intermediate threshold voltages or resistance values, in a manner similar to the case of using reference cells having substantially intermediate threshold voltages or resistance values, the storage state of a memory cell can be read. For simplicity of description, it is assumed herein that information to be stored in a memory cell is binary data, one of storage states is set as a program state, and the other storage state is set as an erase state. The plurality of second output voltages supplied to the divided pieces of one of the inputs of the sense amplifier always include the second output voltage of the reference cell in the program state and the second output voltage in the erase state. Consequently, it is effective that the second output voltage is an intermediate value between the program state and the erase state, and becomes the first output voltage corresponding to the program state or the erase state of the memory cell, which is supplied to the other input of the sense amplifier. By amplifying the difference between the voltages by the sense amplifier and outputting the amplified voltage, information stored in the memory cell can be read.

Further, since either the program state or the erase state is fixed as the state of the reference cell, by introducing the feedback type bias circuit described in the related art into the first and second pre-sense circuits, the effect of increasing the reading speed can be enjoyed. Also in the case of using variable resistive elements as the reference cell and the memory cell, it is unnecessary to form the reference cell having an intermediate resistance value by combination of resistive values of four variable resistive elements, so that the problem of imbalance of volume loads can be solved. Thus, high-speed and stable reading can be performed.

In the semiconductor memory device according to the invention, the sense amplifiers of the number which is at least the same number as that of the reference cells exist independently, and the second output voltages of the plurality of second pre-sense circuits are commonly supplied to the one of the inputs of the sense amplifiers of the same number as that of the reference cells. In the semiconductor memory device according to the invention, the volume load of the second output voltage of each of the plurality of second pre-sense circuits and that of the first output voltage of the first pre-sense circuit can be made equal to each other. Thus, high-speed and stable reading can be performed more reliably.

In the semiconductor memory device according to the invention, the number of the reference cells may be two. The memory cell can store binary data, one of the reference cells is fixed to a state corresponding to one of the binary data, and the other reference cell is fixed to a state corresponding to the other value of the binary data.

According to the invention, the semiconductor memory device exhibiting the effects of the invention can be realized by the simple circuit configuration in which the number of reference cells is two.

In the semiconductor memory device according to the invention, the number of reference cells may be three or more. The memory cell can store binary data, and the reference cells are fixed to states corresponding to the binary data in such a manner that at least one of the reference cells is fixed to a state corresponding to one of the binary data, and at least another one of the reference cells is fixed to a state corresponding to the other value of the binary data.

In the semiconductor memory device according to the invention, since the number of reference cells can be set to three or more, an intermediate value between the program state and the erase state of the second output voltage, which can be effectively set and was described in the first feature, can be adjusted finely. Consequently, adjustment according to the current characteristics of the reference cell and the memory cell in the program state and the erase state can be made. Further, at the time of verification (reading for verification) of the programming operation and erasing operation on a memory cell in a nonvolatile memory, whether the memory cell is in the program state or the erase state is not simply determined but whether the memory cell is sufficiently in the program or erase state or not is determined. Consequently, as the reference level used for the determination, it is preferable to shift the intermediate value between the program state and the erase state toward the program state or the erase state. Therefore, if the number of reference cells is three or more in the semiconductor memory device according to the invention, a reading circuit for verification capable of performing high-speed and stable operation can be realized.

In the semiconductor memory device according to the invention, the first pre-sense circuit and the plurality of second pre-sense circuits have the same circuit configuration, and design dimensions of corresponding circuit elements are the same.

In the semiconductor memory device according to the invention, the first pre-sense circuit includes at least one first separation transistor on a current path between the memory cell and a first output node for outputting the first output voltage, and a first feedback bias circuit for biasing the first intermediate node to a predetermined potential by controlling a current amount of the first separation transistor in accordance with the voltage of the first intermediate node on the memory cell side of the first separation transistor. Each of the plurality of second pre-sense circuits includes at least one second separation transistor on a current path between the reference cell and a second output node for outputting the second output voltage, and a second feedback bias circuit for biasing the second intermediate node to a predetermined potential by controlling a current amount of the second separation transistor in accordance with the voltage of the second intermediate node on the reference cell side of the second separation transistor.

In the semiconductor memory device according to the invention, each of the first and second pre-sense circuits includes the feedback bias circuit. Therefore, even when the current difference of cell currents which change according to the states of the memory cell and the reference cell is small, the difference between output voltages corresponding to the states of the first and second pre-sense circuits can be made large, and the large voltage difference can be output at high speed. Thus, high-speed and stable reading can be realized. Since the reference cell is set to any of the possible states of the memory cell, the problem of the conventional reading circuit using the feedback bias circuit caused by an intermediate state of the reference cell is solved.

In the semiconductor memory device according to the invention, the first pre-sense circuit includes a charging circuit for charging the first intermediate node in a predetermined period, and each of the plurality of second pre-sense circuits includes a charging circuit for charging the second intermediate node in the predetermined period.

In the semiconductor memory device according to the invention, it is possible to suppress the influence of wiring delay caused by increase in the parasitic capacitance and parasitic resistance on a bit line connecting the memory cell and the reference cell and the first and second pre-sense circuits as the capacity of the semiconductor memory device increases, also, it is possible to charge the first and second intermediate nodes at high speed to the predetermined voltage values determined by the feedback-type bias circuits. Thus, the high-speed operation by the feedback bias circuit can be stably performed.

In the semiconductor memory device according to the invention, each of the memory cell and the reference cell includes a nonvolatile memory transistor capable of storing information in accordance with a change in a threshold voltage. Alternatively, each of the memory cell and the reference cell includes a nonvolatile resistive element capable of storing information in accordance with a change in a resistance value.

DETAILED DESCRIPTION OF THE INVENTION

An embodiment of a semiconductor memory device according to the invention (hereinafter, appropriately referred to as "the inventive device") will be described with reference to the drawings.

Figure 1:
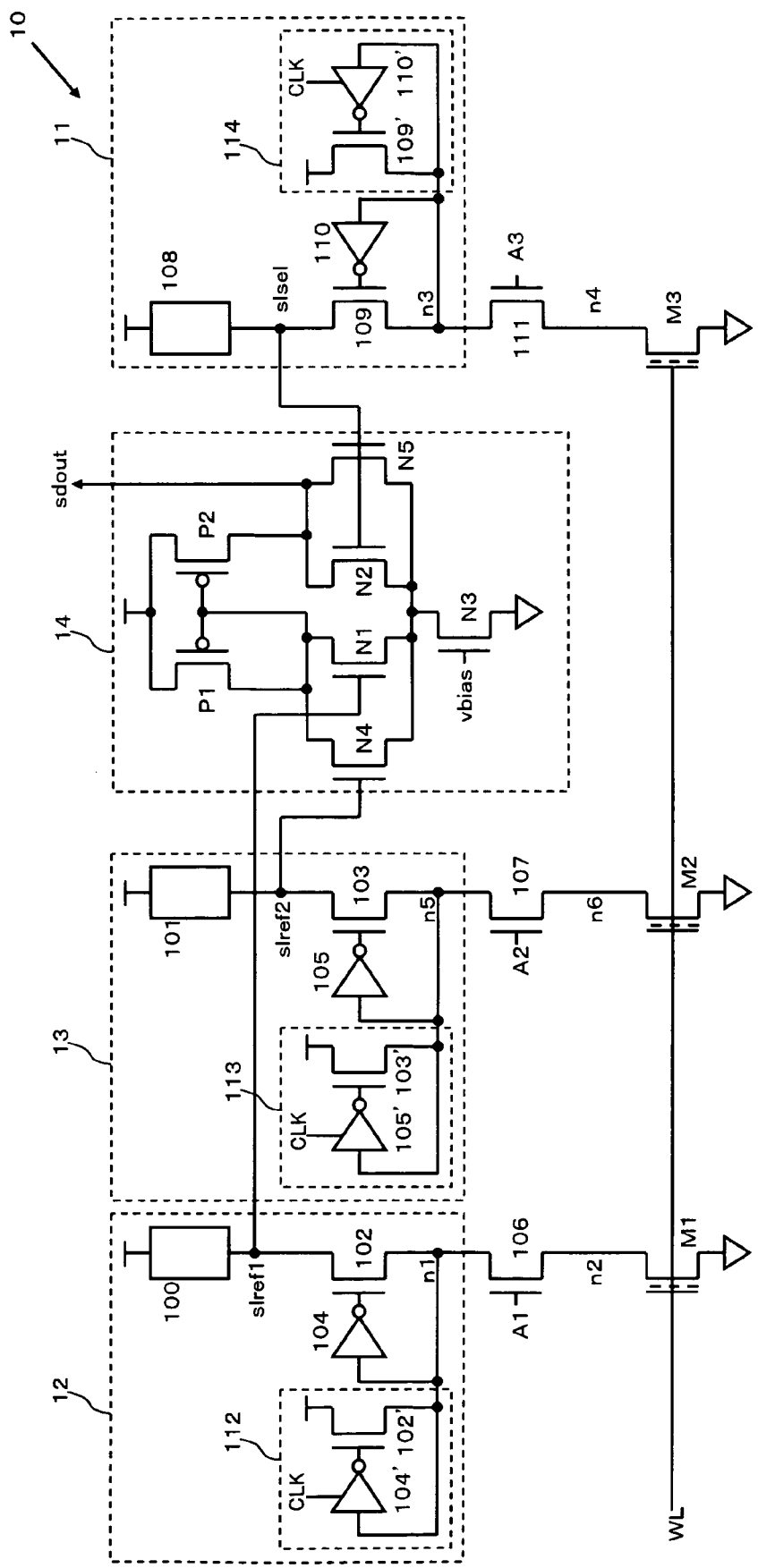
FIG. 1 is a circuit diagram showing an embodiment of a reading circuit of a semiconductor memory device according to the invention.
Figure 2:
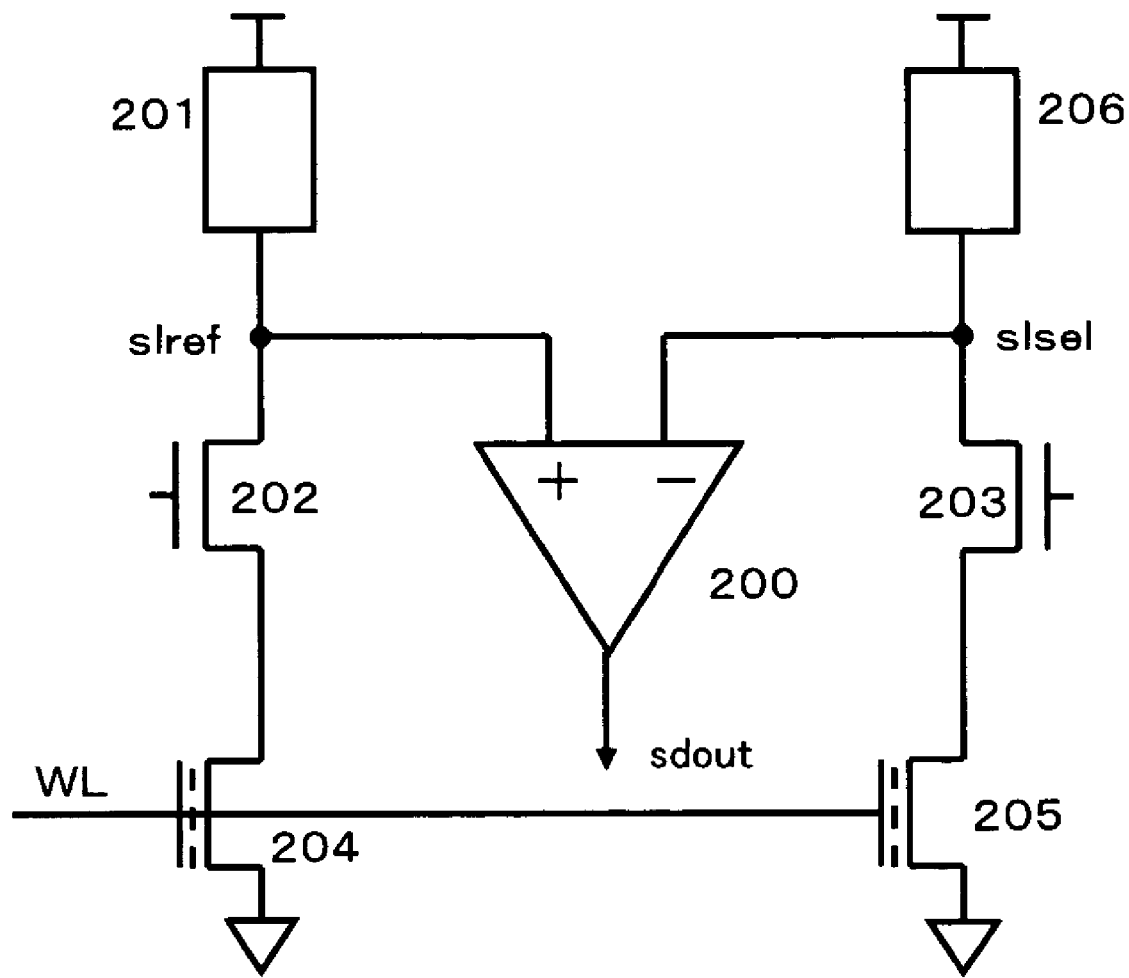
FIG. 2 is a circuit diagram showing a conventional reading circuit of a semiconductor memory device.

The inventive device is constructed by including a reading circuit 10 having a circuit configuration shown in FIG. 1. The inventive device is characterized by the reading circuit 10 (hereinafter, appropriately referred to as "the inventive circuit 10"). As the other configuration of a peripheral circuit part of a memory cell array, an address input circuit, an address decoder circuit, a data input/output circuit, a data program circuit, a control circuit for executing controls regarding reading and programming of data, and the like, a known circuit configuration is appropriately employed in accordance with the kind and capacity of a semiconductor memory device. Since the configuration is not the gist of the present invention, it will not be described herein. In the following description, it is assumed that a flash memory as one of nonvolatile memories is used as a semiconductor memory device, and the flash memory includes a memory transistor having a floating gate structure as a memory cell. Therefore, the storage state of the memory cell is set according to an amount of electrons accumulated in a floating gate, and the storage states appear as different threshold voltages of memory transistor. Specifically, the drain current flowing between the drain and source of a memory transistor in a program state of a high threshold voltage and that in an erase state of a low threshold voltage when the same gate voltage is applied are different from each other. The inventive circuit 10 is a circuit for reading information stored in the memory cell by determining the drain current.

FIG. 1 is a circuit diagram of the inventive circuit 10. The inventive circuit 10 includes, as shown in FIG. 1, a memory cell M3, two reference cells M1 and M2 having plural states (program state and erase state) of the memory cell M3, a first pre-sense circuit 11 for supplying current to the memory cell M3 and outputting the first output voltage according to the storage state of the memory cell M3 from the node slsel, two second pre-sense circuits 12 and 13 for supplying current to the reference cells M1 and M2, respectively, and outputting second output voltages according to the storage states of the reference cells M1 and M2 from nodes slref1 and slref2, respectively, and a sense amplifier 14 constructed by a differential amplification circuit receiving the first output voltage of the first pre-sense circuit 11 as one differential input and each of the second output voltages of the two second pre-sense circuits 12 and 13 as the other differential input.

The plurality of memory cells M3 are usually arranged in an array state in accordance with memory capacity. In FIG. 1, only one memory cell or one memory cell out of plural memory cells selected to be read is shown. In the case where a plurality of memory cells are selected by a single reading operation and are read simultaneously at high speed in a semiconductor memory device having a plurality of data input/output terminals, the plurality of inventive circuits 10 shown in FIG. 1 are necessary.

The reference cells M1 and M2 are connected to the same word line as that of the selected memory cell M3 and are arranged in the same row in the same memory array to which the selected memory cell M3 is connected. Therefore, either the reference cell M1 or M2 is selected according to the row address of the selected memory cell. Further, although the drains of the reference cells M1 and M2 and the selected memory cell M3 are connected to different bit lines (the different bit lines correspond to nodes n4, n2 and n6 in FIG. 1), the reference cells M1 and M2 and the selected memory cell M3 are disposed in the same row in the same memory array, so that they have bit lines of the same length. The parasitic resistance and parasitic capacitance on the bit lines are the same. Although the sources of the reference cells M1 and M2 and the selected memory cell M3 are grounded in FIG. 1, they are actually connected to a common source line. Since the common source line is at the ground level during the reading operation, the sources are substantially grounded.

N-type MOSFETs 111, 106 and 107 are selection transistors for column selection and are inserted among the pre-sense circuits 11, 12 and 13 corresponding to bit lines. Although each of the N-type MOSFETs 111, 106 and 107 is one transistor in FIG. 1, it may have a hierarchical structure of two or more stages.

The pre-sense circuits 11, 12 and 13 have the same circuit configuration. The first pre-sense circuit 11 will be described as an example. The first pre-sense circuit 11 includes a load circuit 108 for supplying current to the memory cell M3, a first separation transistor 109 as an N-type MOSFET provided between the output node slsel and the first intermediate node n3 positioned on the drain side of the selection transistor 111, an inverter 110 having an input connected to the first intermediate node n3 and an output connected to the gate of the first separation transistor 109, and a charging circuit 114 for charging the first intermediate node n3 to a predetermined voltage for a predetermined period. A feedback bias circuit (first feedback bias circuit) is constructed by the first separation transistor 109 and the inverter 110.

The charging circuit 114 has a circuit configuration similar to that of the first feedback bias circuit and is constructed by including a first pull-up transistor 109' taking a form of an N-type MOSFET and an inverter 110'. The first pull-up transistor 109' has a drain connected to a power source voltage, a source connected to the first intermediate node n3, and a gate connected an output of the inverter 110'. The input of the inverter 110' is connected to the first intermediate node n3. The inverter 110' has the same inversion level as that of the inverter 110. The power source is supplied to the inverter 110' by a clock signal CLK which becomes at the power source voltage level only for a predetermined period before and after the rising of a selected word line WL and becomes at the ground level out of the period. An output of the inverter 110' also becomes at the ground level, and the first pull-up transistor 109' is turned off.

The circuit configuration of two second pre-sense circuits 12 and 13 is quite the same as that of the first pre-sense circuit 11 as shown in FIG. 1. The second pre-sense circuit 12 includes a load circuit 100 for supplying current to the reference cell M1, a second separation transistor 102 taking the form of an N-type MOSFET provided between the output node slref1 and the second intermediate node n1 positioned on the drain side of the selection transistor 106, an inverter 104 having an input connected to the second intermediate node n1 and an output connected to the gate of the second separation transistor 102, and the charging circuit 112 for charging the second intermediate node n1 to predetermined voltage for a predetermined period. In this case, a feedback bias circuit (second feedback bias circuit) is constructed by the second separation transistor 102 and the inverter 104. The second pre-sense circuit 13 includes a load circuit 101 for supplying current to the reference cell M2, a second separation transistor 103 taking the form of an N-type MOSFET provided between the output node slref2 and the second intermediate node n5 positioned on the drain side of the selection transistor 107, an inverter 105 having an input connected to the second intermediate node n5 and an output connected to the gate of the second separation transistor 103, and a charging circuit 113 for charging the second intermediate node n5 to predetermined voltage for a predetermined period. Herein, a feedback bias circuit (second feedback bias circuit) is constructed by the second separation transistor 103 and the inverter 105.

The configuration of each of the charging circuits 112 and 113 is the same as that of the charging circuit 114 of the first pre-sense circuit 11. The same clock signal CLK is supplied to inverters 104' and 105'. The repetitive description will not be given here.

Corresponding circuit constants (design dimensions such as gate length and gate width) of the transistors and inverters in the pre-sense circuits 11, 12 and 13 are set to the same values.

Figure 3:
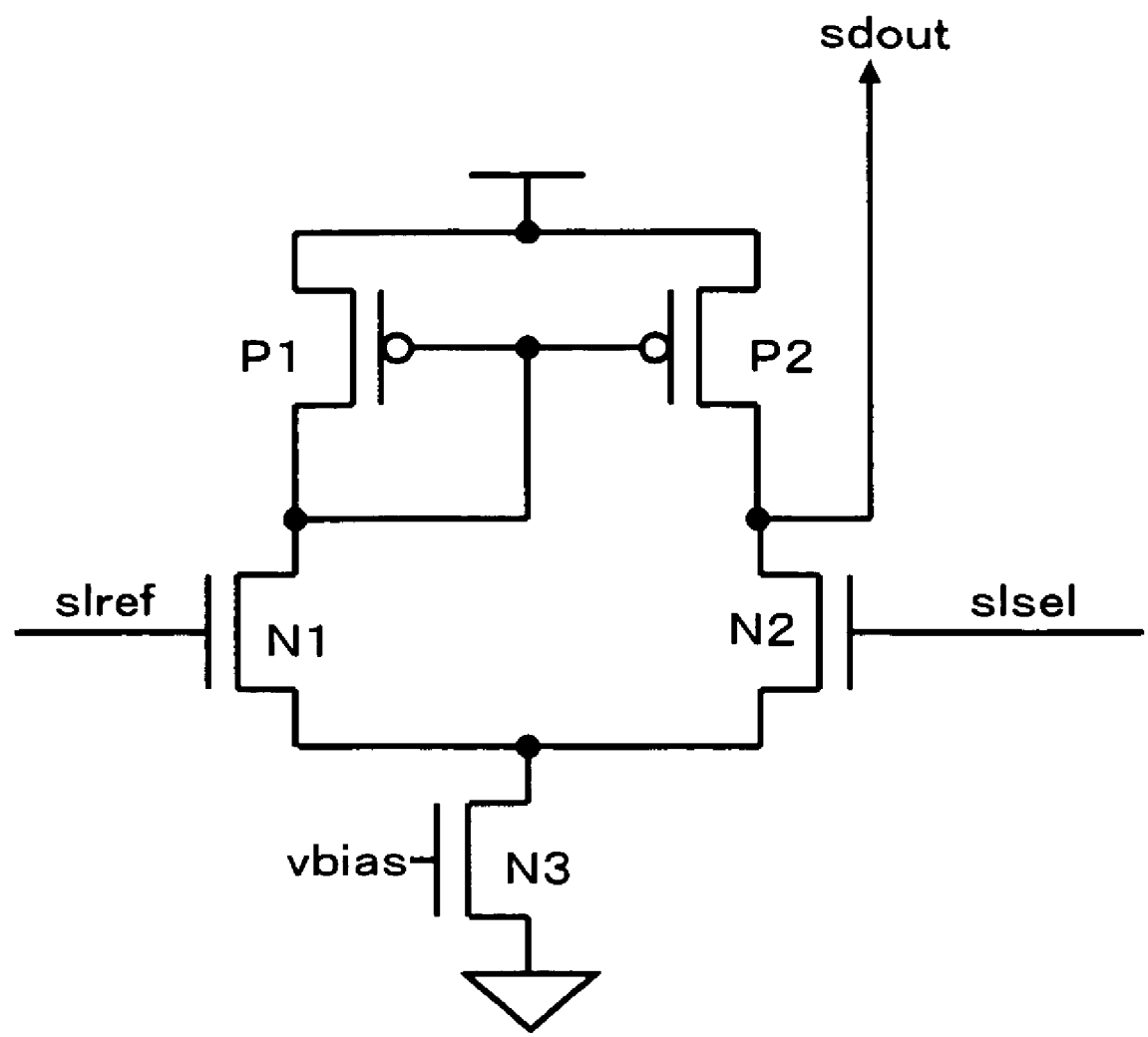
FIG. 3 is a circuit diagram showing an example of a P-channel current mirror-type sense amplification circuit.
Figure 4:
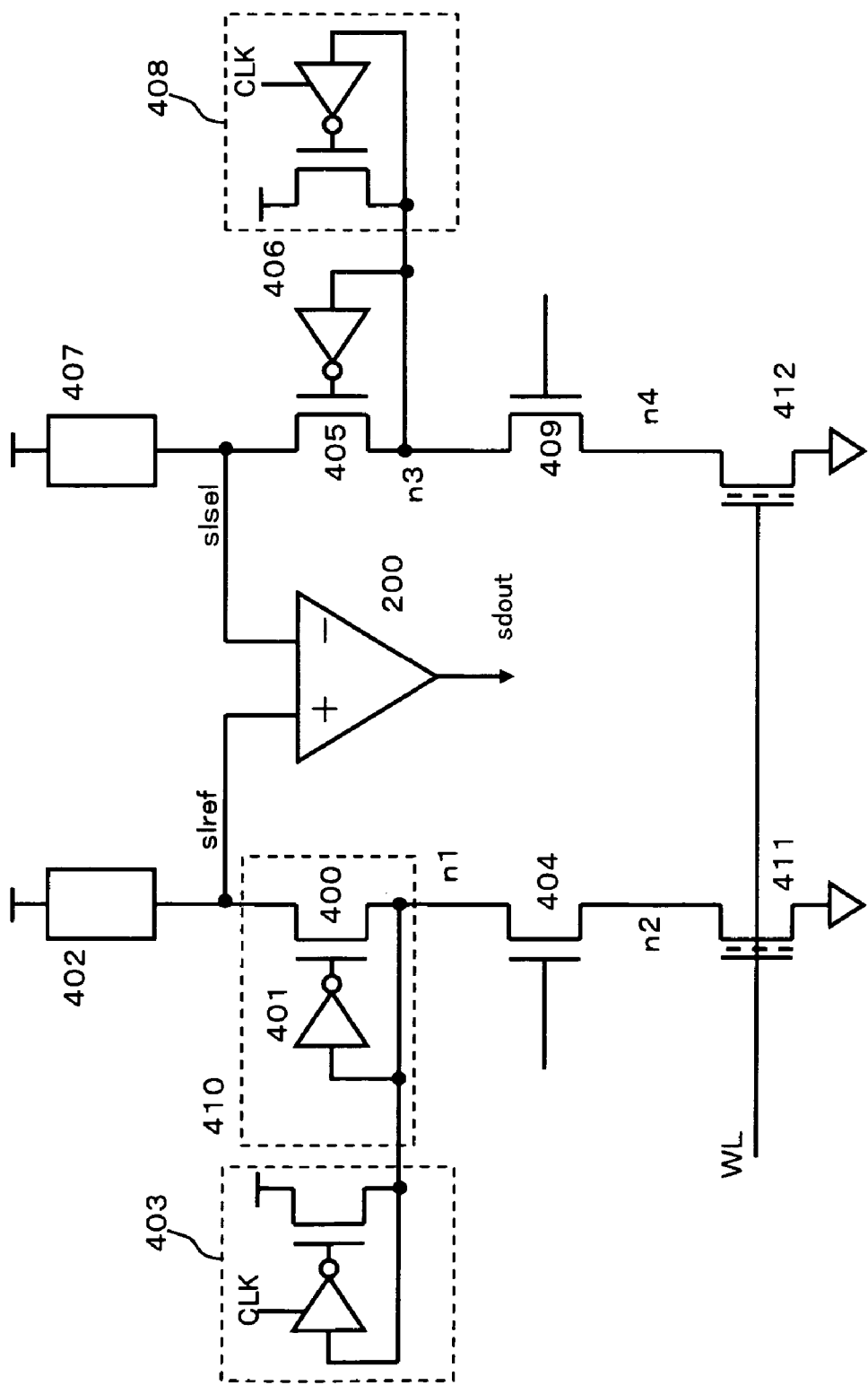
FIG. 4 is a circuit diagram showing a conventional reading circuit in which a feedback-type bias circuit of a semiconductor memory device is introduced.
Figure 5:
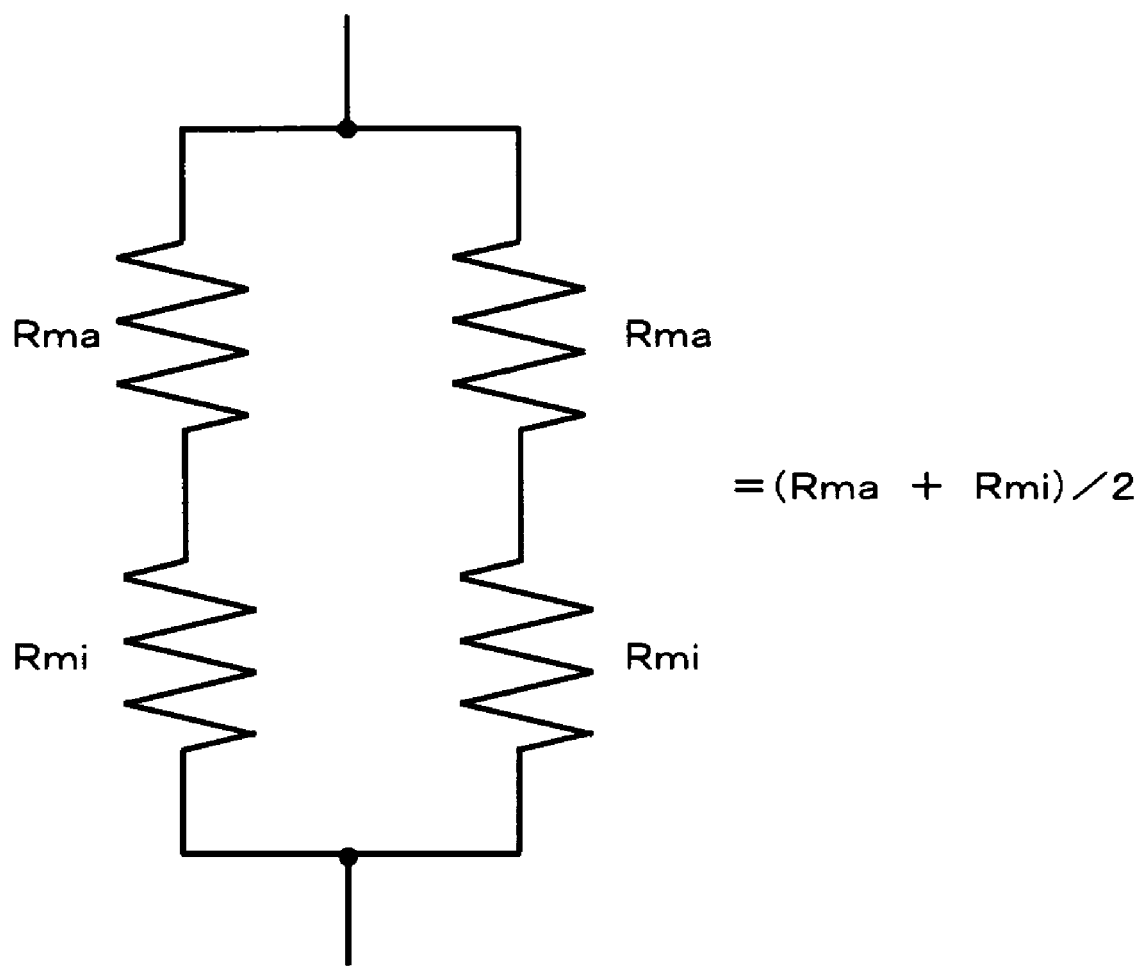
FIG. 5 is a circuit diagram showing a conventional reference cell used in a reading circuit of a semiconductor memory device in which a variable resistive element is used for a memory cell.

Different from the conventional P-channel current mirror-type sense amplification circuit shown in FIG. 3, the sense amplifier 14 has a configuration in which two N-type MOSFETs are arranged in parallel in each of the differential input stages, and transistor sizes (gate length, gate width and the like) of four N-type MOSFETs N1, N2, N4 and N5 are set to the same dimensions. The node slref1 of the second pre-sense circuit 12 and the node slref2 of the second pre-sense circuit 13 are connected to the gates of the differential input transistors N1 and N4 of one of the differential input stages, and the node slsel of the first pre-sense circuit 11 is connected to the gates of the differential input transistors N2 and N5 of the other differential input stage. Although not shown, the node slref1 of the second pre-sense circuit 12 and the node slref2 of the second pre-sense circuit 13 are also connected to the gates of the same differential input transistors N1 and N4 of a sense amplifier of another output bit. With such a configuration, the gate capacitance load of each of the output nodes of the pre-sense circuits 11 to 13 is twice as much as that of each of the differential input transistors N1, N2, N4 and N5. Therefore, the transient response characteristic of the selected memory cell M3 is the same as that in the pre-sense circuit 11, 12 or 13 of the reference cell M1 or M2 in the same storage state.

The operation of the inventive circuit 10 will now be described. For convenience of description, it is assumed that the reference cell M1 is set in the erase state, the threshold voltage of the reference cell M1 is low, the reference cell M2 is set in the program state, and the threshold voltage of the reference cell M2 is high.

The operation principle of the inventive circuit 10 is based on an idea that combined current (Ie+Ip) according to two states (the erase state and the program state) of the reference cells M1 and M2 flow in the differential input transistors N1 and N4 of one of differential input stages in the sense amplifier 14, and 2×Ie or 2×Ip flows in the differential input transistors N2 and N5 of the other differential input stage in the sense amplifier 14 in accordance with the storage state (erase state or program state) of the memory cell M3. At this time, from the relation of Ip>Ie, the relation of 2×Ie<(Ie+Ip)<2×Ip is satisfied. Consequently, the current difference occurs between the two differential input transistor groups. The current difference is differential-amplified, and the output sdout according to the storage state of the memory cell M3 is obtained.

First, when the clock signal CLK rises to the power source voltage level and the charging circuits 112 to 114 are activated, charging of the nodes n1 to n6 is started, and the nodes n1 to n6 are charged to predetermined voltages. At this time, each of the first intermediate node n3 and the second intermediate nodes n1 and n5 is rapidly charged to a voltage level determined by each feedback bias circuit. The voltage level determined by the feedback bias circuit is a voltage level at which a state where the gate-source voltage Vgs of each of the first separation transistor 109 and the second separation transistors 102 and 103 is almost equal to the threshold voltage and the transistor is sufficiently (or almost) cut off can be maintained. Therefore, each of the inverters 110, 104 and 105 outputs an intermediate level, and the voltage level is a value around the inversion level of each of the inverters 110, 104 and 105.

Since the first separation transistor 109 and the second separation transistors 102 and 103 are in a state where the on-state resistance is extremely high or in an off state, the output nodes slsel, slref1 and slref2 of the pre-sense circuits 11, 12 and 13 are charged at high speed to predetermined voltage levels by the load circuits 108, 100 and 101 in a low-load state where the output nodes are separated from the intermediate nodes n3, n1 and n5 and the bit line nodes n4, n2 and n6.

On the other hand, on or before completion of charging of the first intermediate node n3 and the second intermediate nodes n1 and n5, the selected word line WL to be connected to the selected memory cell M3 and the reference cells M1 and M2 rises. The charging period is preset so that the clock signal CLK is reset to the ground level after completion of the charging of the first intermediate node n3 and the second intermediate nodes n1 and n5 and the charging circuits 112 to 114 are made inactive.

When the selected word line WL rises, since the threshold voltage of the reference cell M1 is low, the reference cell M1 is turned on. Current larger than that in the reference cell M2 flows, the voltage levels of the second intermediate nodes n1 and n2 drop, and the second separation transistor 102 is turned on by the inverter 104 of the second feedback bias circuit. Consequently, the node slref1 of the second pre-sense circuit 12 becomes the L level (low voltage level) so as to follow the drop of the second intermediate node n1. On the other hand, even when the selection word line WL rises, since the threshold voltage is high, the reference cell M2 remains in an off state. Alternatively, even when the reference cell M2 is turned on, the amount of current which flows is small. The voltage at the second intermediate node n5 and the node n6 does not drop, and the cut-off state of the second separation transistor 103 is maintained by the inverter 104 of the second feedback bias circuit. Therefore, the node slref2 of the second pre-sense circuit 13 maintains a charging level by the load circuit 101 or, in the case where charging is being performed, charging is continued.

By inputting the second output voltages of the second pre-sense circuits 13 in the reference cells M1 and M2 to the gates of the differential input transistors N1 and N4 in one of the differential input stages in the sense amplifier 14, the currents corresponding to both of the program state and the erase state are passed in parallel via the differential input transistors N1 and N4. When it is assumed herein that current flowing in the differential input transistor N1 corresponding to the erase state is Ie and the current flowing in the differential input transistor N4 corresponding to the program state is Ip, Ip>Ie. The total of currents flowing in the differential input transistors N1 and N4 is equal to (Ie+Ip).

The selected memory cell M3 can be in either the erase state or the program state in accordance with the storage state. In the case where the selected memory cell M3 is in the erase state, in a manner similar to the reference cell M1, the node slsel becomes the low level. By inputting the output voltage corresponding to the erase state to the gates of the differential input transistors N2 and N5 of the other differential input stage in the sense amplifier 14 via the node slsel, current (2×Ie) corresponding to the erase state is passed through the differential input transistors N2 and N5.

On the other hand, when the selected memory cell M3 is in the program state, in a manner similar to the reference cell M2, the node slsel becomes the high level (high voltage level). By inputting the voltage corresponding to the program state to the gates of the differential input transistors N2 and N5 of the other differential input stage in the sense amplifier 14 via the node slsel, the current (2×Ip) corresponding to the program state is passed via the differential input transistors N2 and N5.

As obviously understood from the above, with respect to the total current value (Ie+Ip) corresponding to the reference cells M1 and M2 and the total current value (2×Ie) or (2×Ip) corresponding to the selected memory cell M3, the relation of 2×Ie<(Ie+Ip)<2×Ip is satisfied. Consequently, the current difference is differential-amplified by the sense amplifier 14 and is also subjected to voltage conversion, and the resultant is output from the output node sdout. In the inventive circuit 10 shown in FIG. 1, when the selected memory cell M3 is in the erase state, the output node sdout outputs the H level. When the selected memory cell M3 is in the program state, the output node sdout outputs the L level.

Another embodiment of the inventive circuit 10 will now be described.

In the foregoing embodiment, the case where the current (reference current) flowing in the differential input stage (transistors N1 and N4) on the side of the reference cells M1 and M2 of the sense amplifier 14 is equal to the total (Ie+Ip) of the current value Ie corresponding to the erase state and the current value Ip corresponding to the program state has been described. However, the reference current flowing in the differential input stage on the side of the reference cells M1 and M2 does not always have to be (Ie+Ip). Various reference currents may be generated by optionally combining Ie and Ip using three or more reference cells.

Figure 6:
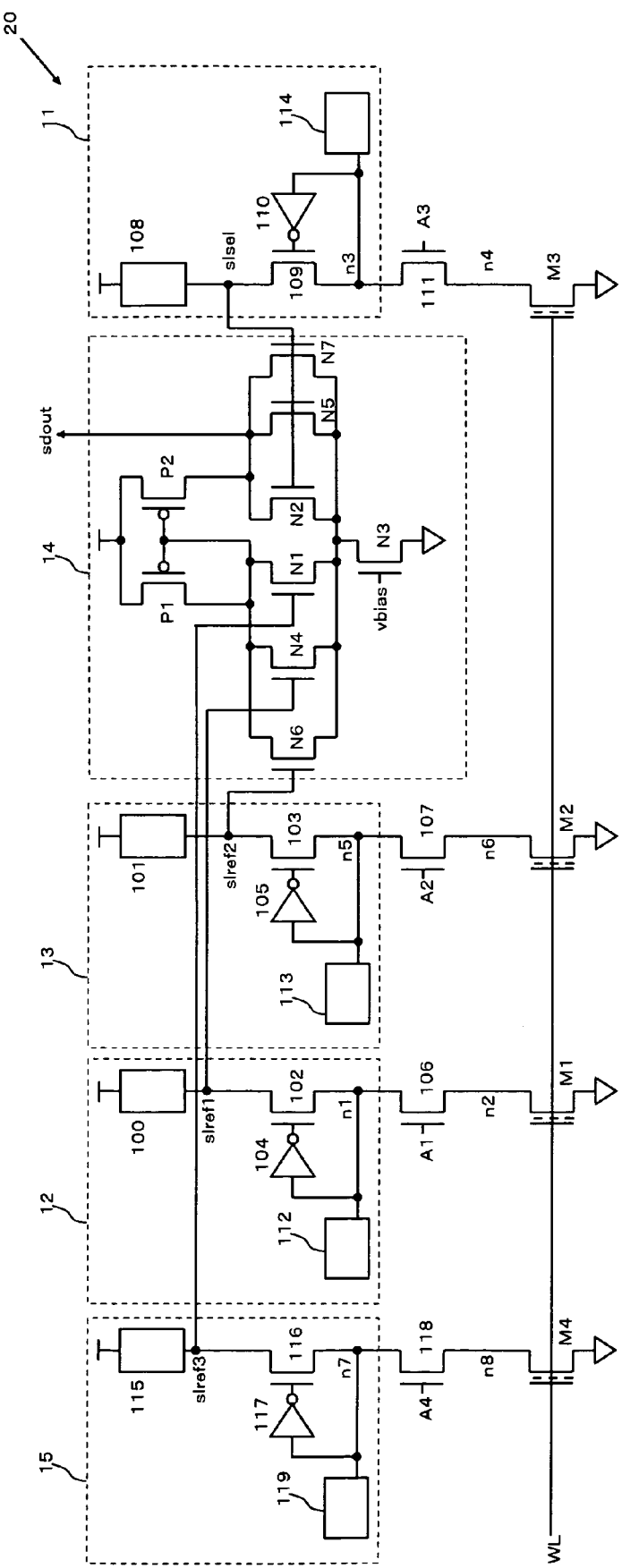
FIG. 6 is a circuit diagram showing another embodiment of the reading circuit of the semiconductor memory device of the invention.

FIG. 6 shows an inventive circuit 20 for generating the reference current by using the three reference cells M1, M2 and M4. The points different from FIG. 1 are the point that the second pre-sense circuit 15 related to the reference cell M4 is added and the point that the number of transistors in the differential input stages in the sense amplifier 14 is increased to three. The other configuration, the functions of the parts, and operations are the same as those of the inventive circuit 10 shown in FIG. 1.

The inventive circuit 20 shown in FIG. 6 can be constructed as not only a reading circuit for normal reading but also a reading circuit for verification for performing a verifying operation after programming or erasing.

For example, in the case where two reference cells out of the reference cells M1, M2 and M4 are in the erase state and the other reference cell is in the program state, the reference current of (2×Ie+Ip) can be generated. By determining that the memory cell M3 for generating the current value of (2×Ie+Ip) or less is in the erase state, a reading circuit for erase verification can be realized. When the output node sdout becomes the H level, it means that current to be determined flowing in the differential input stage on the memory cell side of the sense amplifier 14 has a current value smaller than (2×Ie+Ip). Consequently, it can be determined that the selected memory cell M3 is in the erase state. On the other hand, when the output node sdout becomes the L level, it means that the current to be determined has a current value larger than (2×Ie+Ip), so that it can be determined that erasing of the selected memory cell M3 is insufficient. In this case, it is sufficient to perform the erasing operation again.

For example, when one of the reference cells M1, M2 and M4 is in the erase state and the other two reference cells are in the program state, the reference current of (Ie+2×Ip) can be generated. By determining that the memory cell M3 for generating the current value of (Ie+2×Ip) or higher is in the program state, a reading circuit for program verification can be realized. When the output node sdout becomes the L level, it means that the current to be determined which flows in the differential input stage on the memory cell side of the sense amplifier 14 has a current value larger than (Ie+2×Ip), so that it can be determined that the selected memory cell M3 is in the program state. On the other hand, when the output node sdout becomes the H level, it means that the current to be determined has a current value smaller than (Ie+2×Ip), so that it can be determined that the programming of the selected memory cell M3 is insufficient. In this case, it is sufficient to perform the programming operation again.

By using the inventive circuit 20 of the another embodiment, plural different reference currents can be generated by combination of the erase state and the program state by using three or more reference cells. Consequently, the invention can be also applied to a reading circuit used in the case where a plurality of reference currents are set within a predetermined range and multiple values of three of more values are stored in each memory cell.

In the foregoing embodiments, a flash memory cell is assumed as a memory cell. However, the memory cell is not limited to the flash memory cell. Not only a memory cell in which different storage states appear as different threshold voltages of memory transistors but also memory cells of a variable resistive element type such as MRAM, OUM and RRAM can be also used. In this case, by setting a plurality of reference cells in such a manner that the resistance value of at least one of them is large and the resistance value of at least another one of them is small, the inventive circuits 10 and 20 shown in FIGS. 1 and 6, respectively, can be used.

Although the case where the inversion level of the inverters 110, 104 and 105 of the feedback bias circuits of the pre-sense circuits 11, 12 and 13 and those of the inverters 110', 104' and 105' of the charging circuits 112, 113 and 114 are set to be the same has been described in the foregoing embodiment, it is not always necessary to set the inversion levels of the inverters to be the same. The charging levels of the charging circuits 112, 113 and 114 may be adjusted not only by the inversion levels of the inverters 110', 104' and 105' but also by the timing of the clock signal CLK.

The timing relations such as charging periods of the charging circuits 112, 113 and 114 and the rising timings of the word line and the like described in the embodiment are an example and can be appropriately changed. The configuration in which load circuits of the direct current load types are assumed as the load circuits 108, 100 and 101 and the output nodes slsel, slref1 and slref2 of the pre-sense circuits 11, 12 and 13 are charged in accordance with the operation states of the first separation transistor 109 and the second separation transistors 102 and 103 has been described above. Alternatively, a configuration such that dynamic-type load circuits which are turned on/off by a control signal are used as the load circuits 108, 100 and 101 and are activated synchronously with the rising of the word line or the end of the charging period may be employed.

In the inventive circuit, by providing the charging circuits 112, 113 and 114 for the pre-sense circuits 11, 12 and 13, respectively, high-speed reading can be realized. However, it is not always necessary to provide the charging circuits. By introducing feedback bias circuits to the pre-sense circuits 11, 12 and 13, the effects of the inventive circuit can be maximally displayed. However, the principle of reading of the invention using a plurality of reference cells can be also applied without providing the feedback bias circuits.

As described above in detail, in the semiconductor memory device according to the invention, also in a memory of reading a subtle difference of currents flowing in the memory cell and determining the storage state, the reference current can be generated without using an intermediate state between the on and off states in a conventional reference cell. Thus, high-speed and high-precision reading can be achieved. Since the reference cell having an intermediate threshold voltage between the program state and the erase state becomes unnecessary, the reading circuit which is not easily influenced by noise, variations in processes, and the like can be realized. This is similarly effective also in the case of using a resistance value for information storage. Further, by providing three or more reference cells and combining the program state and the erase state, a plurality of different reference currents can be generated. Thus, high-speed reading can be realized also in the case where multiple values of one or more bits are stored in a cell.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
   a memory cell for storing information in accordance with a change in a state;
   a plurality of reference cells each having at least one of a plurality of possible states of the memory cell;
   a first pre-sense circuit for supplying current to the memory cell and outputting a first output voltage according to a storage state of the memory cell;
   a plurality of second pre-sense circuits for supplying currents to the plurality of reference cells and outputting second output voltages according to storage states of the plurality of reference cells; and
   a sense amplifier which is constructed so that one of inputs of a differential amplification circuit is divided in parallel into the same number of pieces as the number of the reference cells, the second output voltages of the plurality of second pre-sense circuits are supplied to the divided pieces, and the first output voltage of the first pre-sense circuit is supplied to the other input of the differential amplification circuit.

2. The semiconductor memory device according to claim 1, wherein
   both of the inputs of the differential amplification circuit are constructed by MOS transistors of the same number as that of the reference cells,
   the second output voltages of the plurality of second pre-sense circuits are supplied to the gates of the MOS transistors constructing the one of the inputs, and
   the first output voltage of the first pre-sense circuit is supplied to all of gates of the MOS transistors constructing the other input.

3. The semiconductor memory device according to claim 1, wherein
   the sense amplifiers which number is at least the same number as that of the reference cells exist independently, and
   the second output voltages of the plurality of second pre-sense circuits are commonly supplied to the one of the inputs of the sense amplifiers of the same number as that of the reference cells.

4. The semiconductor memory device according to claim 1, wherein the number of the reference cells is two.

5. The semiconductor memory device according to claim 4, wherein
   the memory cell can store binary data,
   one of the reference cells is fixed to a state corresponding to one of the binary data, and
   the other reference cell is fixed to a state corresponding to the other value of the binary data.

6. The semiconductor memory device according to claim 1, wherein the number of reference cells is three or more.

7. The semiconductor memory device according to claim 6, wherein
   the memory cell can store binary data, and
   the reference cells are fixed to states corresponding to the binary data in such a manner that at least one of the reference cells is fixed to a state corresponding to one of the binary data, and at least another one of the reference cells is fixed to a state corresponding to the other value of the binary data.

8. The semiconductor memory device according to claim 1, wherein
the first pre-sense circuit and the plurality of second pre-sense circuits have the same circuit configuration, and design dimensions of corresponding circuit elements are the same.

9. The semiconductor memory device according to claim 1, wherein
the first pre-sense circuit includes at least one first separation transistor on a current path between the memory cell and a first output node for outputting the first output voltage, and a first feedback bias circuit for biasing the first intermediate node to a predetermined potential by controlling a current amount of the first separation transistor in accordance with the voltage of the first intermediate node on the memory cell side of the first separation transistor, and
each of the plurality of second pre-sense circuits includes at least one second separation transistor on a current path between the reference cell and a second output node for outputting the second output voltage, and a second feedback bias circuit for biasing the second intermediate node to a predetermined potential by controlling a current amount of the second separation transistor in accordance with the voltage of the second intermediate node on the reference cell side of the second separation transistor.

10. The semiconductor memory device according to claim 9, wherein
the first pre-sense circuit includes a charging circuit for charging the first intermediate node in a predetermined period, and
each of the plurality of second pre-sense circuits includes a charging circuit for charging the second intermediate node in the predetermined period.

11. The semiconductor memory device according to claim 1, wherein
each of the memory cell and the reference cell includes a nonvolatile memory transistor capable of storing information in accordance with a change in a threshold voltage.

12. The semiconductor memory device according to claim 1, wherein
each of the memory cell and the reference cell includes a nonvolatile resistive element capable of storing information in accordance with a change in a resistance value.

* * * * *